US005445706A

United States Patent [19]

Okuno et al.

[11] Patent Number: 5,445,706

[45] Date of Patent: Aug. 29, 1995

[54] WET TREATMENT ADAPTED FOR MIRROR ETCHING ZNSE

[75] Inventors: Yasuo Okuno; Hitoshi Tamura, both of Yokohama; Tsuyoshi Maruyama, Kawasaki, all of Japan

[73] Assignees: Stanley Electric Co., Ltd., Tokyo; Kanagawa Academy of Science and Technology, Kawasaki, both of Japan

[21] Appl. No.: 226,281

[22] Filed: Apr. 11, 1994

[30] Foreign Application Priority Data

Apr. 14, 1993 [JP] Japan .................................. 5-087244
Mar. 22, 1994 [JP] Japan .................................. 6-050351

[51] Int. Cl.$^{6}$ ........................ B44C 1/22; H01L 21/306

[52] U.S. Cl. .................................. 156/637.1; 156/345; 252/79.2

[58] Field of Search ............... 156/636, 637, 639, 645, 156/647, 662, 345; 252/79.2

[56] References Cited

U.S. PATENT DOCUMENTS 4,501,636 2/1985 Valley ................................ 156/345
4,840,701 6/1989 Stern .................................. 156/637
5,038,068 8/1991 Kushida et al. ................. 156/647 X
5,354,490 10/1994 Yu et al. ............................ 252/79.2

*Primary Examiner*—William Powell
*Attorney, Agent, or Firm*—Frishauf, Holtz, Goodman, Langer & Chick

[57] ABSTRACT

Group II–VI compound semiconductor crystal containing Zn as group II element or mixed crystal containing the compound semiconductor crystal is etched by an etchant made of $H_2SO_4$ aqueous solution dissolved with potassium permanganate $KMNO_4$. Preferably, an etchant is moved round in a cylindrical vessel by a stirrer, and group II–VI compound semiconductor wafers are held by a jig, disposed generally in parallel with the flow of the etchant, immersed into the etchant, and mirror-etched.

22 Claims, 5 Drawing Sheets

WET TREATMENT ADAPTED FOR MIRROR ETCHING ZNSE

BACKGROUND OF THE INVENTION a) Field of the Invention

The present invention relates to a wet treatment or process, and more particularly to a wet process suitable for mirror etching a group II–VI compound semiconductor containing Zn as a group II element and a mixed crystal containing such a compound semiconductor which are expected to be used as the material of light emitting elements, and to a method of manufacturing a semiconductor device with a mirror etching process.

In this specification and claims, sulfuric acid or $H_2SO_4$ means conc sulfuric acid (96 mol % $H_2SO_4$) and hydrogen peroxide or $H_2O_2$ means 30 mol % $H_2O_2$. The reminder composition is $H_2O$.

b) Description of the Related Art

Etchants for a group II–VI compound semiconductor ZnSe are known, such as sodium hydroxide (NaOH) aqueous solution, bromine (Br) methanol solution, and ammonium hydroxide ($NH_4OH$) hydrogen peroxide ($H_2O$) solution.

In the case of NaOH aqueous solution, NaOH aqueous solution having 5 to 50 weight % is heated up to 80° to 100° C. for etching ZnSe. However, NaOH aqueous solution is anisotropic etchant so that etch pits are generated and mirror exchange is difficult.

In the case of Br methanol solution, Br is dissolved in methanol to 0.5 to 5 weight % for etching ZnSe. However, Br ethanol solution is an etchant which generates pits, and hence mirror etching is difficult. Furthermore, an etching speed (or rate) of a high quality crystal is slow. Still further, this etchant contains a volatile component so that the composition of the etchant may be degraded or made inconsistent.

In the case of $NH_4OH$–$H_2O_2$ solution, ZnSe is etched by solution having a volume ratio of $NH_4OH : H_2O_2 = 2 : 1$ to $6 : 1$. Although $NH_4OH$: $H_2O_2$ solution is effective for the (1 1 1) B plane of ZnSe, the (1 1 1) A plane of ZnSe is hardly etched and ineffective.

Furthermore, since a robust oxide film is formed during etching by $NH_4OH : H_2O_2$ solution, the etching speed lowers as the etching continues for a long time, being unable to etch ZnSe at a uniform etching speed.

As described above, of conventional ZnSe etchants, NaOH solution and Br methanol solution are difficult for use in mirror etching because these solutions are anisotropic depending upon a crystallographic plane orientation of ZnSe.

$NH_4OH : H_2O_2$ solution is also not suitable for mirror etching because this solution can hardly etch the (1 1 1) A plane of ZnSe and the etching speed cannot be maintained constant.

Wafers of group II–VI compound semiconductor such as ZnSe, ZnTe, and ZnS presently available are still small in size. A Si wafer having a small size is also used for experiments or the like. Semiconductor wafers having such a relatively small size have been wet processed in simple manners described hereinunder.

FIG. 6A illustrates a simplest method. A wafer 53 of a II–VI compound semiconductor is placed on the bottom of a beaker 51, by directing its surface to be wet processed upward. An etchant 52 such as solution of aqua regia, sodium hydroxide, and Br methanol is poured into the beaker 51. A worker holds the beaker 51 with a hand and shakes it to rotate or agitate the etchant to etch the wafer 53. After the etching, the etchant is discarded and the wafer is rinsed by a great amount of pure water.

FIG. 6B illustrates another method using a wafer mount jig. A wafer 53 is placed in a basket 54 having a sufficient amount of liquid draining holes. After an etchant 52 is poured into a beaker 51, the lower portion of the basket jig 54 is immersed into the etchant 52. The basket jig 54 is moved up and down with a hand to move the etchant uniformly on the surface of the wafer 53. After the etching, the basket 54 is picked out of the beaker 51 and placed in another beaker in which pure water is overflowing.

The above-described simple wet etchings are difficult to form a stable flow of etchant. Since ZnSe of group II–VI compound semiconductor crystal has a strong ionicity, the etching state changes with even a small change of etchant component and mirror etching is disturbed.

Since the speed of a wet treatment is governed by an etchant flow regulated by a manual work, it is difficult to stably perform a wet process with a good reproductivity. In an etching process, variations of an etching speed and an etching depth are generated. The bottom surface of a wafer placed on the bottom of a beaker directly contacts the latter. In this case, a sufficient supply of etchant is difficult, and a wet treatment such as surface cleaning or the like by etching is performed substantially only for the upper surface of a wafer.

It is difficult to place a plurality of wafers on the bottom of a single beaker. If a wafer lies on the top of another wafer or collides with another wafer while etchant is agitated, variations of etching are generated and reproductivity lowers.

If a wafer is placed on the bottom of a beaker and etchant is moved round in the beaker, the wafer rubs the bottom of the beaker and collides against the side wall of the beaker. Such mechanical shocks may form defects in the wafer crystal.

SUMMARY OF THE INVENTION

It is an object of the present invention to provide etchant for mirror etching a group II–VI compound semiconductor crystal containing Zn as a group II element and a mixed crystal containing such crystal, and an etching method of mirror etching such crystal and mixed crystal.

It is another object of the present invention to provide a wet process technique having a good reproductivity and less danger of introducing defects in crystal.

It is a further object of the present invention to provide a wet process technique capable of stably and efficiently mirror etching a group II–VI compound semiconductor wafer.

According to one aspect of the present invention, an etchant is provided which is sulfuric acid aqueous solution dissolved with potassium permanganate. This etchant can etch an object material made of group II–VI compound semiconductor crystal containing Zn as a group II element and mixed crystal containing such crystal.

It has been found that sulfuric acid aqueous solution with dissolved potassium permanganate has a constant etching speed of group II–VI compound semiconductor even during a long time and is not dependent on the orientation of a crystal plane.

It is possible to mirror etch group II–VI compound semiconductor crystal containing Zn. Since etching can be performed deeply, this etchant can be used effectively for removing a surface layer of a wafer or the like changed by mechanical and/or chemical processing. It is therefore possible to manufacture group II–VI compound semiconductor devices of a good quality.

According to another aspect of the present invention, a wet treatment method is provided which includes the steps of moving round wet treatment liquid in a cylindrical vessel, holding a flat member to be processed and disposing it in generally parallel with a flow of the wet treatment liquid and dipping the flat member in the rotating wet treatment liquid.

A stable flow of wet treatment liquid can be formed by moving it round in the cylindrical vessel. By holding a flat member to be processed and disposing it in generally parallel with a flow of the wet treatment liquid and dipping it in the rotating wet treatment liquid, it is possible to make the surface of the flat member contact the treatment liquid while maintaining a stable flow of the treatment liquid without giving an excessive mechanical impact to the flat member.

By controlling the rotation speed, it is possible to reliably control the flow of the wet treatment liquid with a good reproductivity. Therefore, variations of treatment of a wafer surface are reduced, and the reproductivity of treatment speed is improved. It is possible to control the wet treatment speed at a high precision by the flow rate of a wet treatment liquid, without changing the temperature and composition of the wet treatment liquid such as etchant.

Since wafers are held generally still, defects to be introduced by mechanical shocks can be effectively prevented.

In this manner, a stable wet treatment is possible. In mirror etching, a uniform etching can be progressed at a wafer surface.

DETAILED DESCRIPTION OF THE PREFERRED EMBODIMENTS

Embodiments of the present invention will be described by taking as an example the case where a single crystal of a group II–VI compound semiconductor ZnSe is etched by sulfuric acid aqueous solution dissolved with $KMnO_4$.

(1 1 1) plane wafers and (1 0 0) wafers were diced from a ZnSe single crystal grown by liquid phase crystal growth. These wafers were lapped by using alumina based fine powder abrasives, and thereafter polished with polishing cloth. Lastly, powder abrasives attached to the crystal surface were completely removed to prepare etching samples.

Next, sulfuric acid aqueous solution having a volume ratio of $H_2SO_4 : H_2O = 1 : 1$ to $1 : 10$ was prepared. $KMNO_4$ was dissolved by 5 to 100 mg in $H_2SO_4$ aqueous solution of 25 ml to prepare etchant.

Figure 1A:
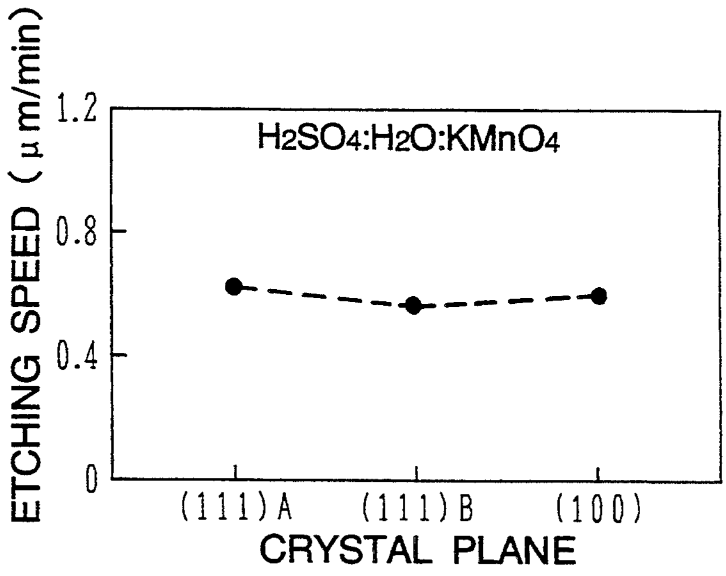
FIGS. 1A, 1B, and 1C are graphs explaining the etching according to an embodiment of the invention, the graph of FIG. 1A showing a crystal plane dependency upon an etching speed, the graph of FIG. 1B showing an etched depth relative to an etching time, and the graph of FIG. 1C showing a change in an etching speed relative to an amount of dissolved $KMNO_4$.

FIG. 1A is a graph showing a dependency of an etching speed on a cystallographic crystal plane. The etchant used is sulfuric acid of 25 ml having a volume ratio of $H_2SO_4 : H_2O = 1 : 4$ with $KMnO_4$ of 50 mg dissolved therein. From the graph, it can be understood that the etching speed is nearly constant for the (1 1 1) A plane, (1 1 1) B plane, and (1 0 0) plane of ZnSe.

From this experiment, it can be understood that sulfuric acid aqueous solution dissolved with $KMnO_4$ provides a uniform etching characteristic even for group II–VI compound semiconductor which has a strong ionicity and a polar crystal surface. This means that mirror etching is possible independently from crystal plane.

Figure 1B:
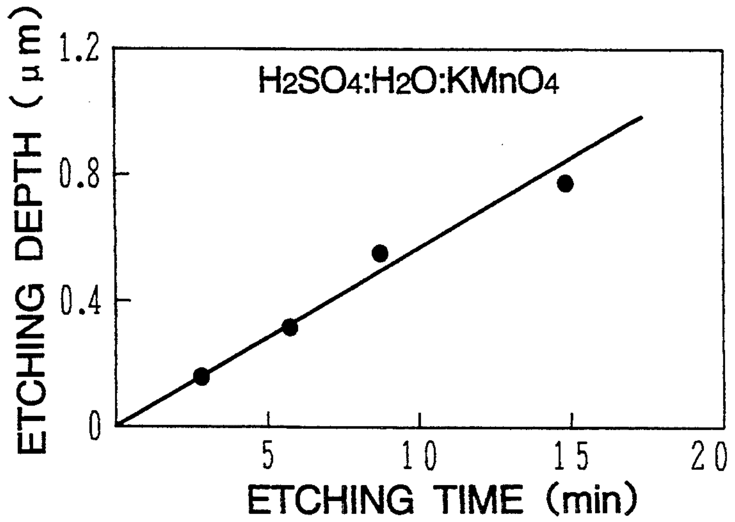

FIG. 1B is a graph showing a relationship between an etching depth and an etching time. The etchant used was the same as used for FIG. 1A. ZnSe wafers having the (1 1 1) B plane were used.

From this graph, it can be understood that the etching depth is approximately proportional to the etching time. It is therefore possible to control the etching depth by the etching time.

Figure 1C:
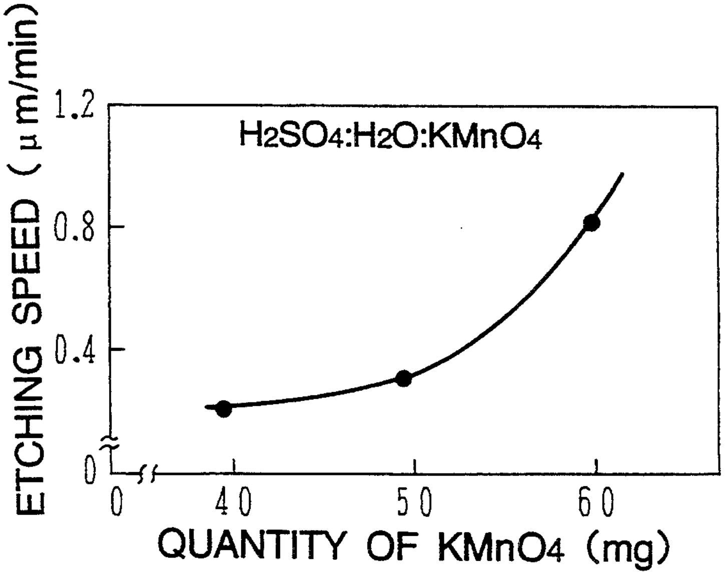

FIG. 1C is a graph showing a relationship between the etching speed and the amount of $KMnO_4$ dissolved in the etchant. ZnSe having the (1 1 1) B plane was used.

The etchants made of sulfuric acid of 25 ml having a volume ratio of $H_2SO_4 : H_2O = 1 : 4$ with $KMnO_4$ of 40 mg, 50 mg, and 60 mg dissolved therein, were evaluated.

From the graph, it can be understood that as the amount of $KMNO_4$ increases, the etching speed increases. The ratio of the increase in etching speed to the increase in amount of dissolved $KMnO_4$ is greater than a linear relation (a higher order relation). It is therefore possible to obtain an etchant having a desired wide range of etching speed by changing the amount of dissolved $KMnO_4$.

In the above embodiment, the composition of sulfuric acid as solvent was set to a volume ratio of $H_2SO_4 : H_2O = 1 : 4$, and $MnO_4$ of 40 mg to 60 mg was dissolved in sulfuric acid of 25 ml. The other composition settings may also be used.

The state of etching looked like mirror etching when sulfuric acid aqueous solution having a volume ratio of $H_2SO_4 : H_2O = 1 : 3$ or less ($\leqq 1 : 3$) was used and $MnO_4$ of 20 mg or more (20/25=4/5 or more using l and g units) was dissolved. A good mirror etching state was observed when sulfuric acid aqueous solution having a volume ratio of $H_2SO_4 : H_2O = 1 : 4$ to $1 : 5$ was used and $KMRO_4$ of 40 to 60 mg (40/25=8/5 to 60/25=12/5 using l and g units) was dissolved.

$KMno_4$ is widely known as oxidant and its nature is dependant upon the property of solvent. In the above embodiment, use of sulfuric acid aqueous solution having a volume ratio of $H_2SO_4: H_2O = 1 : 3$ or more showed a dependency of etching speed upon a crystal plane.

In addition, use of $KMnO_4$ of about 20 mg or less per sulfuric acid aqueous solution of 25 ml showed inconsistent etching. Therefore, the composition of etchant to be used for mirror etching is preferably set so as not to exhibit anisotropy and inconsistent etching. The etchant of this embodiment is not necessary to be heated. It may be used at the room temperature so that it is easy to use, oxygen is not generated, and the composition of etchant is stable.

Furthermore, etching can be made deep so that it can be used effectively for removing a changed surface layer of a wafer or the like, allowing a good quality semiconductor device to be manufactured. For example, the embodiment etchant can be used for etching the surface of an underlying substrate on which epitaxial growth is performed, for etching before forming a surface structure such as forming electrodes, and for selective etching.

In the foregoing, etching single crystal ZnSe has been described. The etchant of this embodiment is supposed to be effective for other Zn chalcogenide compounds, and other group II–VI compound semiconductors containing Zn as a group II element and mixed crystals containing such semiconductor.

The crystal treatment method of this embodiment is applicable to a method of manufacturing group II–VI compound semiconductor devices, which method has processes of diffusion, ion inplantation, epitaxial growth, and the like relative to a mirror surface of a group II–VI compound semiconductor substrate containing Zn.

The present inventor's have developed an etching technique suitable for mirror-etching group II–VI compound semiconductor wafers by $H_2SO_4$: $H_2O$ : $KMnO_4$.

Figure 2:
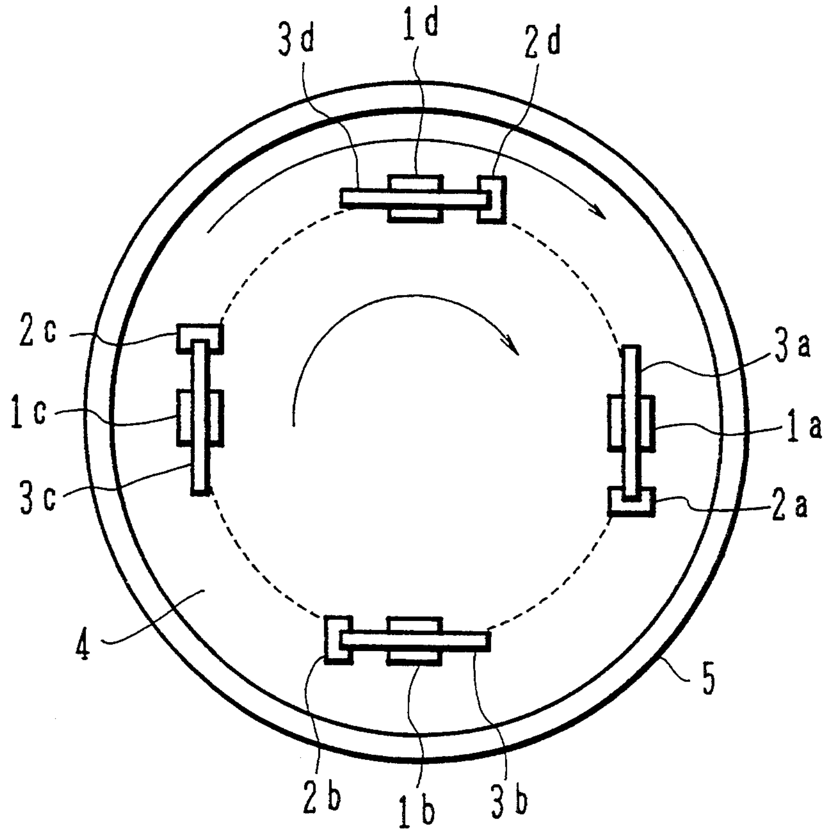
FIG. 2 is a schematic plan view explaining the wet process according to an embodiment of the invention.

FIG. 2 is a schematic plan view explaining a wet treatment according to an embodiment of the invention. Wafers 3 are held by wafer mount jigs 1, 2 at a plurality of positions and housed in a cylindrical vessel 5 at an intermediate level or height of the vessel. Wet treatment liquid 4 is poured into the cylindrical vessel 5 and moved round in the direction of an arrow.

The wet treatment liquid 4 is stably moved round and the wafers 8 are immersed in the wet treatment liquid and disposed generally in parallel with the flow of the wet treatment liquid, to thus perform a wet treatment uniformly on the surfaces of the wafers 3.

The cross sectional area of each wafer mount jig 1, 2 is made as small as possible in the direction perpendicular to the flow of the wet treatment liquid 3 so as not to disturb the flow of the wet treatment liquid 4. For example, each wafer mount jig 1 is made of a single thin plate supporting the lower end of the wafer 3, and each wafer jig 2 is made of another thin plate disposed at a higher position than the wafer mount jig 1. It is preferable to form a number of through openings in the jigs 1, 2 in order not to disturb the flow of the treatment liquid 4.

It is preferable to form a space for accommodating a rotating mechanism under the wafer housing space defined by the mount jigs 1, 2. The rotating mechanism may be formed by a magnetic stirrer or a motor driven fin.

In FIG. 2, four sets of wafer mount jigs 1*a* to 1*d* and 2*a* to 2*d* have been shown. A set of the wafer mount jigs 1*a* to 1*d* and a set of the wafer mount jigs 2*a* to 2*d* each may be formed by a single member. The whole of the wafer mount jigs 1, 2 may also be formed integrally by a single member.

Since the wet treatment liquid 4 moves round in the cylindrical vessel 5, the flow rake of the wet treatment liquid 4 changes with the radial position from the center axis of the cylindrical vessel 5. It is preferable to dispose each wafer along a cylindrical plane at a predetermined radius in order to perform a uniform wet treatment.

With the configuration of a plurality of wafers disposed along a cylindrical plane at the same radius, the wet treatment liquid 4 can be considered to flow separately on the outer and inner sides of each wafer. In order to perform a wet treatment uniformly on both the sides of each wafer, it is desirable to make the wet treatment liquid flow substantially equally on both the inner- and outer surfaces of each wafer. From this reason, it is desirable to determine the cylindrical plane at such a radius along which the wafers are disposed that the wet treatment liquid 4 of substantially the same volume can flow on the inner and outer sides of the wafers. Also, the wafers are preferably disposed at the middle of level in the depth of the treatment liquid.

An embodiment, intended not to be limitative, of etching group II–VI compound semiconductor ZnSe will be described.

A ZnSe crystal manufactured by liquid phase growth was sliced at a desired plane, e.g., (1 1 1) plane to work it into wafers. These ZnSe wafers were mechanically lapped and then polished to form mirror surfaces. After polishing and forming mirror surfaces, ultrasonic washing was performed to remove abrasives remaining on the surfaces of wafers.

A plurality of wafers manufactured in the above manner were held by wafer mount jigs and etched in a beaker.

Figure 3A:
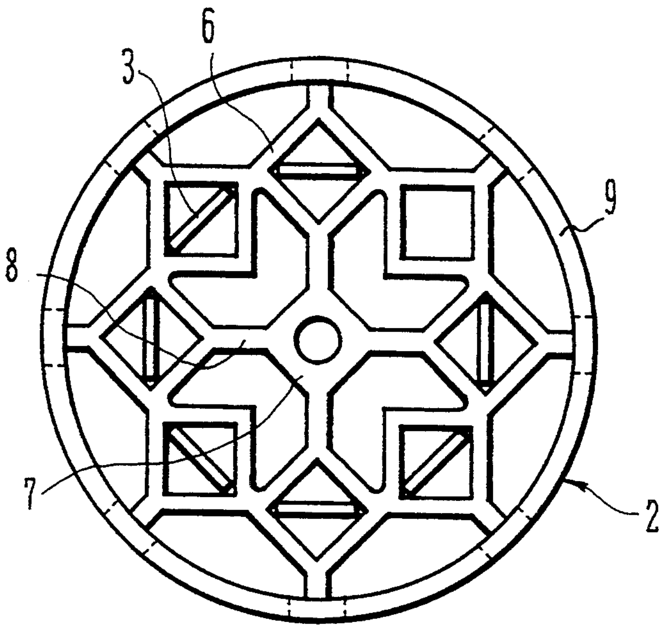
FIG. 3A and 3B are plan views of an upper and a lower part of a wafer mount jig according to an embodiment of the invention.
Figure 3B:
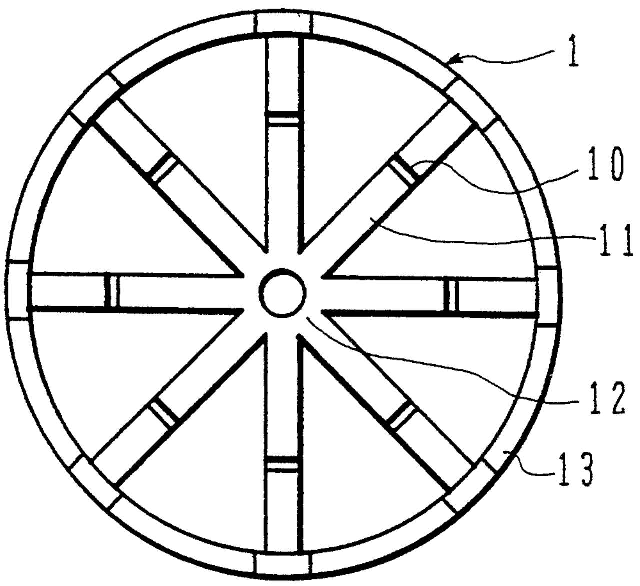

FIGS. 3A and 3B are plan views showing a set of two different wafer mount jigs. FIG. 3A shows a basket net jig to be mounted at the upper position, and FIG. 3B shows a basket base jig to be mounted at the lower position.

Referring to FIG. 3A, the basket net jig 2 has eight rhomboid meshed areas 6 at the same radius into which areas wafers 3 are put in and held. The rhomboid of each meshed area has a diagonal line in the radial direction and the other diagonal line in the circumferential direction. These meshed areas 6 are connected via arms 8 to a common central area 7. The common central area 7 is formed with a circular hole in which a support rod is fitted.

A cylindrical outer wall 9 is provided coupling to the meshed areas 6 at the outside thereof. The outer wall 9 has a height suitable for stably holding wafers 3, and the meshed areas 6 are coupled to the top of the outer wall 9.

Referring to FIG. 3B, the basket base jig 1 for supporting the lower ends of wafers 3 has eight arms 11 radially disposed, each arm having a groove 10 into which the lower end of each wafer is entered. A central area 12 of the basket base jig 1 is formed with a circular hole through which the support rod enters. The outer end of each arm 11 is coupled to a cylindrical outer wall 13. The outer wall 13 has a height suitable for disposing a member to be wet treated at generally the center of the depth of a wet treatment liquid. The arms 11 are coupled to the top of the outer wall 13.

The jigs shown in FIGS. 3A and 3B are made of polytetrafluoroethylene (Teflon) having a high resistance to chemicals. The jigs are made of a thin plate member worked to have a smooth surface excepting the outer circumference areas thereof, in order to establish a smooth flow of etchant. The outer diameters of the outer walls 9 and 13 are preferably generally equal to the inner diameter of the beaker, so that etchant is supplied to the wafers only from the inside of the baskets by inhibiting the flow of etchant from the outside of the baskets. With this configuration, a stable flow of etchant can be realized.

Figure 4:
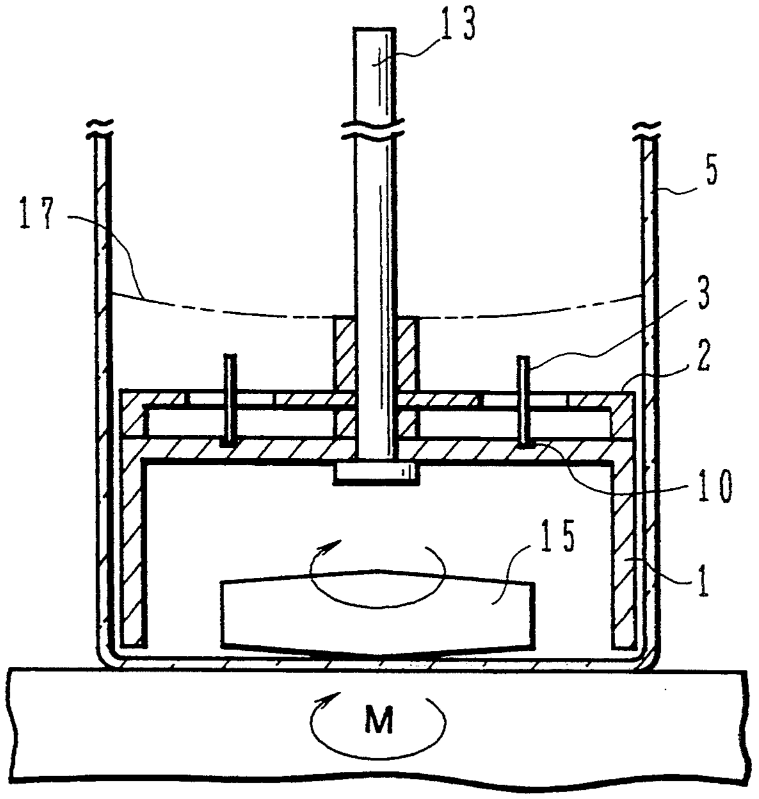
FIG. 4 is a schematic cross sectional view showing an etching state according to an embodiment of the invention.

FIG. 4 shows the assembly of the upper basket net jig 2 and the lower basket base jig 1 which are supported by the same support rod 13 and housed in the beaker 5. The basket net jig 2 stably seats on the basket base jig 1.

The outer diameter of the jigs 1, 2 are about 50 mm if the beaker 5 has a capacity of 100 ml. Prior to mounting the jigs 1, 2, a magnetic stirrer 15 is placed on the bottom of the beaker 5. The stirrer 15 is a magnet coated with Teflon or the like, and has a diameter of about 8 mm and a length of about 30 mm. The stirrer 15 rotates when a rotary magnetic field M is applied from the bottom. Wafers are inserted into the spaces defined by the thombold meshed areas 6 along the diagonals in the circumferential direction at the cylindrical plane having generally the same radius, and the lower ends of the wafers are inserted into the grooves 10 of the basket base jig 1.

The positions of the jigs 1, 2 for supporting wafers are designed so that generally the same volume of etchant flows on both the inner and outer sides of wafers 3. With this configuration, a difference of an etching state between the inner and outer surfaces of wafers is reduced.

An etchant 17 is poured into the beaker 5 and rotated by the stirrer 15, the stable rotation of the etchant 17 being ensured.

An etchant 17 based on potassium permanganate and sulfuric acid aqueous solution was used which enables mirror etching relative to any crystal plane of ZnSe. The composition of the etchant is $KMnO_4$ : $H_2SO_4$ : $H_2O$ = 120 mg: 12 ml : 48 ml.

The stirrer was rotated in the beaker filled with this etchant 17 at the rotation speed which determines a predetermined etching flow rate. After the flow rate was stabilized, the basket jigs 1, 2 loaded with wafers 3 were immersed into the etchant 17. The etchant flowed generally in parallel with the wafer surface. After a predetermined etching time lapsed, the baskets 1, 2 were picked up from the beaker, and then washed with pure water together with the wafers. The water was replaced by methanol. The baskets 1, 2 were then immersed into dichloromethane and subjected to ultrasound cleaning for about 30 minutes.

The flow rate of the etchant can be controlled by the rotation speed of the stirrer. In the range of the stirrer rotation speed from 200 to 1000 rpm under the conditions that the basket jigs 1, 2 are loaded, the etchant flow rate changed generally linearly with the stirrer rotation speed. Use of this linear range facilitates the etching control.

Figure 5:
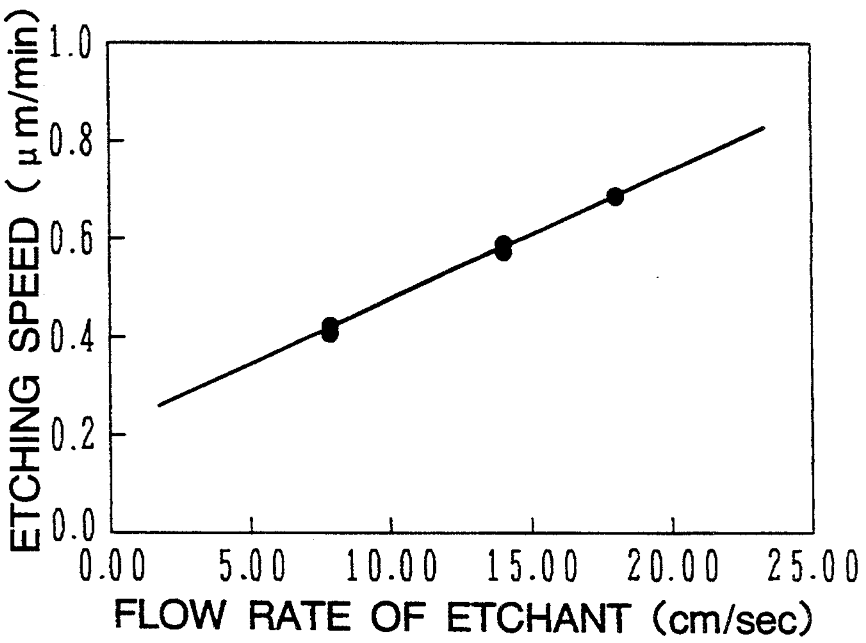
FIG. 5 is a graph showing a change in an etching speed relative to an etchant flow rate.
Figure 6A:
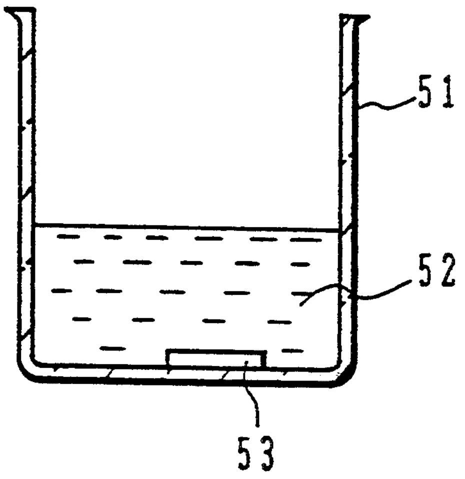
FIGS. 6A and 6B are schematic cross sectional views explaining conventional etching technique.
Figure 6B:
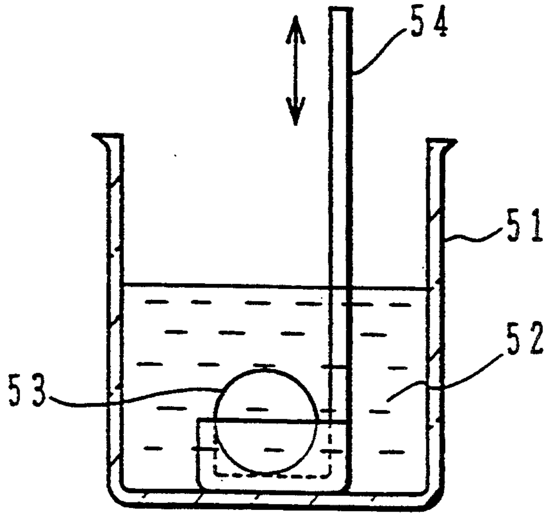

FIG. 5 is a graph showing a relationship between an etchant flow rate at the wafer surface and an etching speed. The abscissa represents an etchant flow rate at the wafer surface in the unit of cm/sec, and the ordinate represents an etching speed in the unit of $\mu$m/min. As seen from this graph, as the etchant flow rate increase, the etching speed increases linearly.

By measuring such fundamental experimental data in advance, it is possible to control ZnSe etching at a high precision by setting proper stirrer rotation speeds.

A relationship between an etchant flow rate and an etching variation in ZnSe wafer etching was examined. At an etchant flow rate over 20 cm/sec, a fluctuation of the rotation of etchant and an etching variation were observed. However, at an etchant flow rate of 20 cm/sec or slower, good mirror etching was performed.

In the above embodiment, the wafer mount jigs having a particular dimension have been described. Various shapes and dimensions of the jigs may be used. The material of the jigs may be changed depending upon the composition of etchant. The etchant composition can also be varied in a wide range.

Etching proceeds stably and uniformly under a stable rotation of etchant obtained by using a rotation drive mechanism such as a stirrer. An etching speed can be changed at a high precision by changing the stirrer rotation speed. For example, in the case of mirror etching, an etching speed can be changed while retaining the mirror etching capability.

Conventionally, the temperature and composition of etchant have been changed to change an etching speed. With this method, performance of etching a wafer changes with the etching speed, resulting in a rough surface of an etched wafer. If an etching speed is changed by changing only the etchant flow rate while maintaining the temperature and composition of the etchant constant, it is possible to control the etching speed in a wide range while retaining the basics of etching. By using the above-described etchant, it was possible to control the etching speed at a desired value in the range from 0.3 to 0.8 $\mu$m/min.

Etchant can move round in the beaker, and the basket jigs allow all wafers to be positioned in parallel with and symmetrically with the flow of the etchant. As a result, highly uniform etching is possible for a batch process of a plurality of wafers.

Because the wafer- mount jigs are kept still in the beaker while rotating etchant by a stirrer, it is possible to prevent mechanical shocks from being applied to wafers and thus prevent defects from being formed in wafers.

Almost the whole surfaces of a plurality of wafers can be etched at the same time and at the same etching characteristics, thereby improving the total wafer cleaning effects.

Because the wafer surface can be etched uniformly, a changed surface layer formed during lapping or abrasing can be effectively removed and good semiconductor devices can be manufactured.

The wafer plane is not limited to the (1 1 1) plane, but any wafer plane such as (1 1 0) and (1 0 0) planes can be adopted with the same advantageous effects.

Eching characteristics can vary with the etching conditions, e.g. with the temperature. Therefore, the preferred numerical values and ranges mentioned hereinabove are not very critical, but rather approximate.

In the foregoing, ZnSe mirror etching has been described. A wet treatment other than etching can also be performed with the jigs and the cylindrical vessel as described above. A material to be processed or treated is not limited to ZnSe. It is effective particularly for semiconductor crystals which have been difficult to be subjected to wet treatments such as etching, for example, group II–VI compound semiconductor crystals containing Zn as group II element such as ZnS, ZnSe, and ZnTe, and mixed crystals containing such compound semiconductor.

The present invention has been described in connection with the preferred embodiments. The invention is not limited only to the above embodiments. It is apparent to those skilled in the art that various modifications, improvements, combinations and the like can be made without departing from the scope of the appended claims.

What is claimed is:

1. An etchant for etching semiconductor comprising $H_2SO_4$ aqueous solution dissolved with potassium permanganate $KMNO_4$.

2. An etchant according to claim 1, wherein said $H_2SO_4$ aqueous solution has a volume ratio of $H_2SO_4$ to $H_2O$ of about $\frac{1}{3}$ or less.

3. An etchant according to claim 1, wherein a ratio of the quantity of said $H_2SO_4$ aqueous solution in the unit of litter to the quantity off said potassium permanganate in the unit of gram is about 4/5 or more.

4. An etchant according to claim 3, wherein said $H_2SO_4$ aqueous solution has a volume ratio of $H_2SO_4$ to $H_2O$ of about $\frac{1}{3}$ or less.

5. An etchant according to claim 1, wherein said $H_2SO_4$ aqueous solution has a volume ratio of $H_2SO_4$ to $H_2O$ of about 1/5 to about $\frac{1}{4}$, and a ratio of the quantity of said $H_2SO_4$ aqueous solution in the unit of litter to the quantity of said potassium permanganate in the unit of gram is about 8/5 to about 12/5.

6. A crystal treatment method of etching a crystal workpiece made off group II–VI compound semiconductor crystal containing Zn as group II element or mixed crystal containing said compound semiconductor crystal by an etchant of $H_2SO_4$ aqueous solution dissolved with potassium permanganate $KMnO_4$.

7. A crystal treatment method according to claim 6, wherein said etching is performed at the room temperature.

8. A crystal treatment method according to claim 6, wherein said etching is performed in a cylindrical vessel by moving round said etchant.

9. A crystal treatment method according to claim 8, wherein said etchant is moved round by rotating a stirrer in said cylindrical vessel.

10. A crystal treatment method according to claim 8, wherein said etching is performed by disposing a plurality of workpieces along a cylindrical plane substantially concentrical to the center axis of said cylindrical vessel.

11. A crystal treatment method according to claim 10, wherein said cylindrical plane divides said etchant into generally two equal volumes.

12. A crystal treatment method according to claim 9, wherein said stirrer is rotated at a speed around which flow rate of said etchant changes linearly with the rotation speed of the stirrer.

13. A method of manufacturing a semiconductor device comprising the step of etching a wafer made of group II–VI compound semiconductor crystal containing Zn as group II element or mixed crystal containing said compound semiconductor crystal by an etchant of $H_2SO_4$ aqueous solution dissolved with potassium permanganate $KMnO_4$.

14. A method according to claim 13, further comprising the step of mirror polishing said wafer prior to said etching step.

15. A wet treatment process comprising the steps of: moving round treatment liquid in a cylindrical vessel; and holding a flat plate member to be treated by a jig, disposing said member generally in parallel with the flow of said treatment liquid, and immersing said member into said rotating treatment liquid.

16. A wet treatment process according to claim 15, wherein the volumes of said treatment liquid flowing on the inner and outer sides of said flat plate member are generally equal under the condition that said flat plate member is immersed into said rotating treatment liquid.

17. A wet treatment process according to claim 15, wherein said treatment liquid is an etchant containing potassium permanganate, sulfuric acid, and water, and said wafer is a group II–VI compound semiconductor wafer.

18. A wet treatment process according to claim 17, wherein the volumes of said treatment liquid flowing on the inner and outer sides of said flat plate member are generally equal under the condition that said flat plate member is immersed in said rotating treatment liquid.

19. A wet treatment process according to claim 17, wherein said step of moving round said treatment liquid moves round an etchant by a stirrer at a flow rate of about 20 cm/sec or slower on the surface of said flat plate member.

20. A wet treatment process according to claim 18, wherein said step of moving round said treatment liquid moves round an etchant by a stirrer at a flow rate of 20 cm/sec or slower on the surface of said flat plate member.

21. A wet treatment apparatus comprising:

a cylindrical vessel having an upper open end;

a rotation mechanism for moving round treatment liquid in said cylindrical vessel; and a jig for holding a flat plate member to be treated and disposing said flat plate member generally in parallel with the flow of said rotating treatment liquid.

22. A wet treatment apparatus according to claim 21, wherein said jig includes thin flat members disposed at least at two different heights, said jig being capable of holding said flat plate member along a cylindrical plane at the radial position allowing said treatment liquid to be divided into generally two equal volumes.

* * * * *